United States Patent
Rees et al.

[19]

[11] Patent Number: 5,953,190
[45] Date of Patent: Sep. 14, 1999

[54] ESD PROTECTION CIRCUIT FOR I/O BUFFERS

[75] Inventors: David Rees, Overton; James Lutley, Southampton; Sandeep Pant, Basingstoke, all of United Kingdom

[73] Assignee: Cypress Semiconductor Corp., San Jose, Calif.

[21] Appl. No.: 08/850,511

[22] Filed: May 2, 1997

[51] Int. Cl.$^6$ .................................................. H02H 4/00
[52] U.S. Cl. ............................................. 361/56; 361/111
[58] Field of Search ................................. 361/18, 54, 56, 361/58, 111, 119, 91, 93, 98, 101; 326/26, 27, 30, 31, 34, 56–58, 68, 81–85, 113; 327/309, 310, 318–321, 328

[56] References Cited

U.S. PATENT DOCUMENTS 5,570,043 10/1996 Churchill ................................... 326/81

*Primary Examiner*—Ronald W. Leja
*Attorney, Agent, or Firm*—Christopher P. Maiorana, P.C.

[57] ABSTRACT

An electrostatic discharge (ESD) protection circuit for an output transistor coupled to an I/O pin of an integrated circuit, including a logic circuit having at least one data input, a tristate enable input, and an tristate output coupled to a gate node of the output transistor wherein the tristate output is placed in a high impedance state in response to the tristate enable input. The ESD protection circuit also includes a tristate enable circuit which drives the tristate enable input according to the presence or absence of an ESD event on the I/O pin. During normal operation, the tristate enable circuit applies a first logic level to the tristate enable input such that the tristate output of the logic circuit is placed in a low impedance state, and during an ESD event on the I/O pin, the tristate enable circuit applies a second logic level to the tristate enable input such that the tristate output of the logic circuit is placed in a high impedance state.

18 Claims, 3 Drawing Sheets

ESD PROTECTION CIRCUIT FOR I/O BUFFERS

BACKGROUND OF THE INVENTION

1. Field of the Invention

This invention relates to a protection circuit which improves the ability of an integrated circuit to withstand electrostatic discharges (ESD), and more particularly to an ESD protection circuit for input and/or output (I/O) buffers.

2. Discussion of Background

In recent years, there has been a need to protect the input and output (I/O) pins of an integrated circuit from electrostatic damage arising, for example, from high electrostatic voltages in the handling environment. To address this problem, typically all I/Os of the integrated circuit may be required to pass specific tests which try to mimic real world conditions. One of these tests is the human body model (HBM) test in which a capacitor is charged to some large voltage, for example 2,000 volts, and then is discharged into the I/O pins of the integrated circuit through a 1.5 k ohm resistor. The other I/O pins of the integrated circuit are typically left floating, although the ground (Vss) pin may be tied to ground. During the discharge the actual voltage applied to the I/O pin does not reach the voltage across the capacitor because of the voltage drop across the 1.5 k ohm resistor. The integrated circuit may be required to withstand a minimum voltage applied to the capacitor and discharged through the 1.5 k ohm resistor without sustaining damage, which typically manifests itself as an increased leakage current on the I/O pin.

FIG. 5 is a schematic showing a four finger output pull down transistor of an integrated circuit connected to an I/O pin 20 of the integrated circuit. A complete pull down transistor circuit connected to the I/O pin 20 may consist of one or more transistors as shown in FIG. 5. In FIG. 5, the pull down transistor includes multiple fingers 40 serving as gates and connected to node N3, sources 30 connected to VSS, and drains 50 connected to an I/O pin 20 of the integrated circuit. When the ESD capacitor is charged, for example, to 2,000 volts with respect to ground, and then discharged through a 1.5 k ohm resistor into the I/O pin 20 of the integrated circuit, damage may occur to the output pull down transistor. If the pull down transistor (or single transistor device) consists of multiple fingers 40, for example, as shown in FIG. 5, the current should preferably be carried uniformly across the width of each transistor finger 40 to prevent damage during an ESD discharge.

Typically, when a high voltage (e.g., 13 volts) is applied to an I/O pin of the integrated circuit, there may be many paths by which the voltage and its associated current can be discharged to ground (note that the voltage applied to the ESD capacitor will be effectively divided across the 1.5 k ohm resistor and the on resistance of the transistor which is typically quite small, and hence the voltage at the I/O pin 20 of the integrated circuit may only reach 13 V of the 2000 V applied to the ESD capacitor). One of these paths may occur, for example, when one finger of the pull down transistor "snaps back". The term "snap back" refers to a partial breakdown across a channel region under the transistor finger and between active regions of the device. Under this condition, the transistor drain voltage decreases because the drain current increases because the apparent resistance of the channel under the transistor finger drops rapidly. The particular channel region under a specific transistor finger that breaks down first is randomly or statistically selected, depending on various process related differences produced during the manufacturing and/or fabrication of the individual transistors.

When a high voltage (e.g., 13 volts) is applied to an I/O pin 20 of the integrated circuit as a result of an ESD event, a path by which the voltage and its associated current can be discharged to VSS (ground) may be, for example, for one transistor finger 40 of a pull down transistor to "snap back" as discussed above. FIG. 6, for example, is graph of drain voltage versus drain current of a transistor finger 40 of a multi-finger device, for example as shown in FIG. 5, when a relatively high voltage is applied to the I/O pin 20 of the integrated circuit.

As shown in FIG. 6, when the transistor finger 40 "snaps back" it passes a relatively large amount of drain current from the drain 50 to the source 30 to VSS. The voltage on the I/O pin 20 of the integrated circuit is reduced from a first breakdown voltage of, for example, 13 volts to, for example, 8 volts. The transistor finger 40 snapping back appears like a resistor between the source and drain so that the drain current through the transistor finger 40 continues to increase if the drain voltage across the transistor finger 40 (i.e., on the I/O pin 20 of the integrated circuit) recovers and continues to increase, as shown in the "snapback region" in FIG. 6. Two things can happen as the drain voltage on the I/O pin 20 of the integrated circuit increases again:

a) another transistor finger 40 may snap back; or b) the snapped back transistor finger 40 may reach a second breakdown voltage and go into another even higher drain current state that may exceed its design characteristics and/or parameters, as shown in FIG. 6.

Although a transistor finger 40 of a multi-finger pull down transistor may pass a large drain current when in the snap back region of the first breakdown voltage, this drain current tends to flow evenly across the width of the transistor finger 40 from the drain to the source and is typically not destructive. In the second snap back region of the second breakdown voltage, the drain current is not uniform across the transistor finger 40 and can cause permanent damage to the integrated circuit, potentially resulting in catastrophic failure and/or excessively high leakage current during normal operation.

To prevent damage it is desirable to ensure that the first breakdown voltage of the second and subsequent fingers is triggered before the second breakdown voltage of the first finger is reached. For unsalicided technologies, the current through the snapped back finger of a multi-finger pull down transistor can be limited and controlled by the drain (and/or the source) diffusion resistance so that a large current through the resistance requires such a large voltage on the I/O pad that another of the fingers is more likely to suffer a first breakdown before the voltage across the snapped back finger rises to the second breakdown voltage. On salicided technologies, the diffusion resistance is very low and so an external resistance of, for example, polysilicon may be required between the I/O pin and each finger of the multi-finger pull down transistor to obtain the above described effect. However, large drain/source resistances may be incompatible with a relatively low output voltage when the output pull down transistor has to sink a high value of d.c. current $I_o$ in normal operation, for example, 64 mA.

SUMMARY OF THE INVENTION

Accordingly, one object of this invention is to provide a novel ESD protection circuit capable of detecting an ESD event on an I/O pin of an integrated circuit.

Another object of the present invention is to provide a novel ESD protection circuit which reduces the amount of damage to a transistor during an ESD event.

A further object of the present invention is to provide a novel ESD protection circuit for an integrated circuit which consumes very little DC power during normal operation of the integrated circuit.

It is also an object of the present invention to provide a novel ESD protection circuit for an integrated circuit which is relatively insensitive to power supply noise during normal switching operation of the integrated circuit.

It is also another object of the present invention to provide a novel ESD protection circuit which reduces the breakdown voltage of transistor fingers during an ESD event.

It is also a further object of the present invention to provide a novel ESD protection circuit which places a gate node of a pull down transistor of an integrated circuit into a high impedance state during an ESD event.

These and other objects are achieved according to the present invention by providing a novel ESD protection circuit for an output transistor coupled to an I/O pin of an integrated circuit, including a logic circuit having at least one data input, a tristate enable input, and an tristate output coupled to a gate node of the output transistor wherein the tristate output is placed in a high impedance state in response to the tristate enable input. The ESD protection circuit also includes a tristate enable circuit which drives the tristate enable input according to the presence or absence of an ESD event on the I/O pin. During normal operation, the tristate enable circuit applies a first logic level to the tristate enable input such that the tristate output of the logic circuit is placed in a low impedance state, and during an ESD event on the I/O pin, the tristate enable circuit applies a second logic level to the tristate enable input such that the tristate output of the logic circuit is placed in a high impedance state.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein.

DESCRIPTION OF THE PREFERRED EMBODIMENTS

Figure 1:
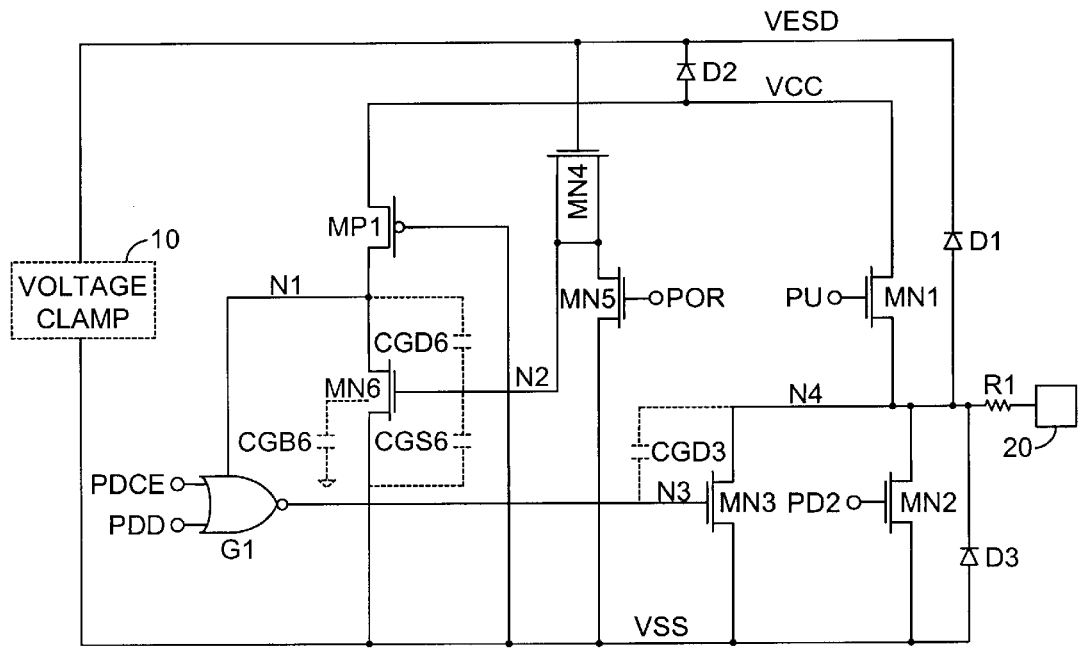
FIG. 1 is a circuit diagram of an ESD protection circuit which uses a power on reset signal and is coupled to an output buffer having an N-channel pull up transistor and pair of N-channel pull down transistors, according to a first embodiment of the present invention.

Referring now to the drawings, wherein like reference numerals designate identical or corresponding parts throughout the several views, and more particularly to FIG. 1 thereof, there is illustrated an ESD protection circuit coupled to an output buffer of an integrated circuit, according to a first embodiment of the present invention, including transistors MN4–MN6 and MP1, diodes D1–D3, logic gate G1, and optional voltage clamp circuit 10.

Figure 4:
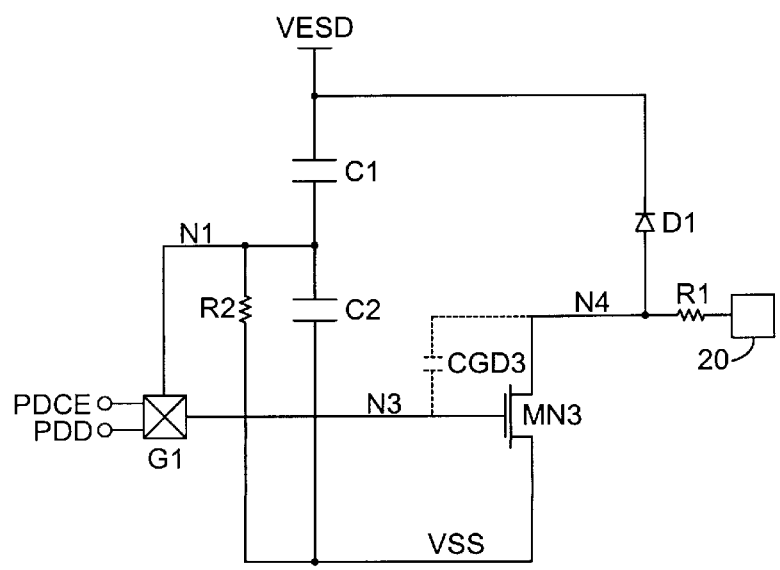
FIG. 4 is a simplified circuit diagram of an ESD protection circuit similar to the circuits of FIGS. 1, 2 and 3 for explaining the operation of the ESD protection circuit of the present invention.
Figure 5:
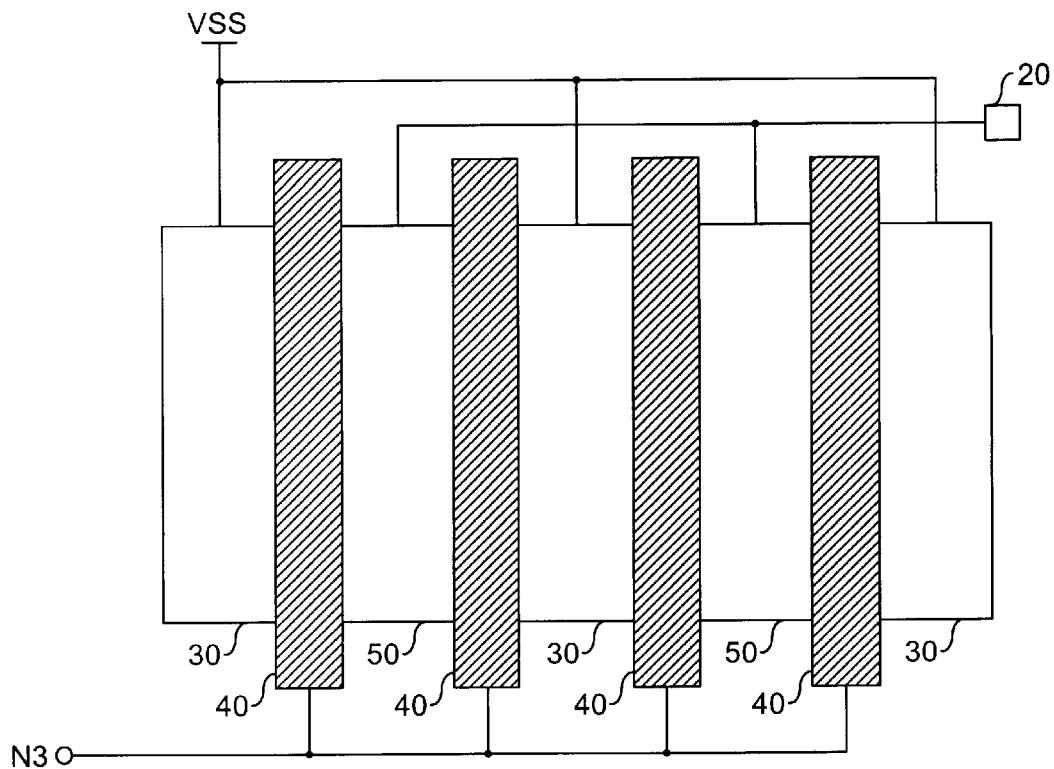
FIG. 5 is a schematic showing a four finger pull down transistor used for explaining the operation of the ESD protection circuit of the present invention.
Figure 6:
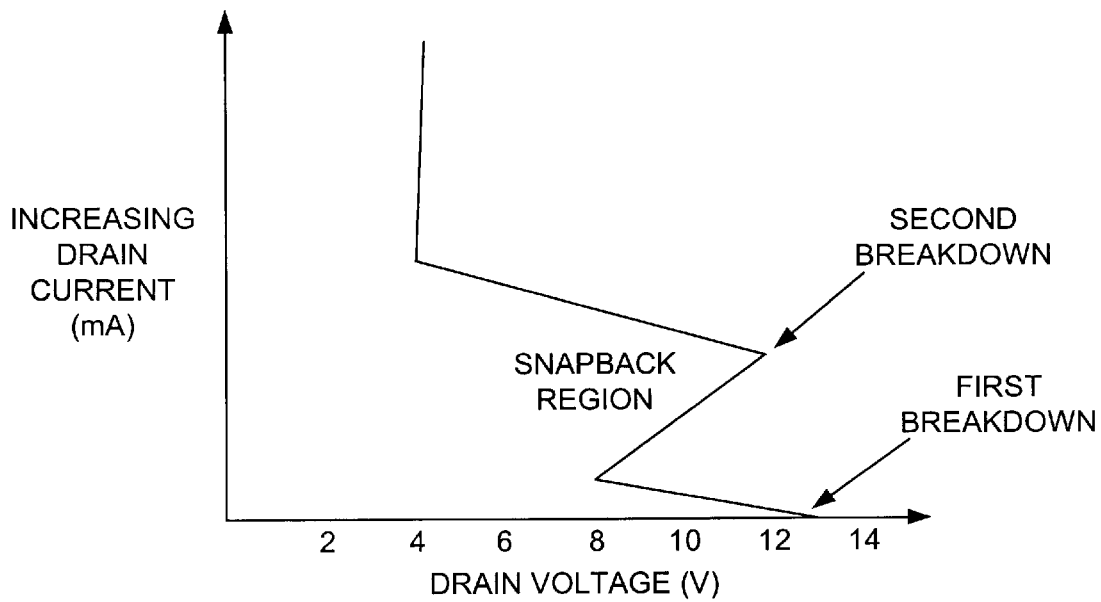
FIG. 6 is a graph showing the relationship of the drain voltage versus the drain current of a transistor finger of FIG. 5 during an ESD event.

FIG. 4 illustrates, in simplified form, a model of certain circuit elements shown in FIG. 1 and is used in to explain the operation of the ESD protection circuit according to the present invention. Referring to FIG. 4, if the voltage on VESD is subject to an AC signal (e.g., from an ESD event), then this AC voltage change is voltage divided by the C1/C2 combination (i.e., capacitor C1 is formed by transistor MN4 and acts as a voltage divider with the capacitor C2 formed by the gate node to source/drain capacitances $C_{gs6}/C_{gd6}$ of transistor MN6 of FIG. 1). Hence, a fraction of the voltage change applied to VESD can be used to pull the tristate enable input of the logic circuit G1 at node N1 high, causing the tristate output of the logic circuit G1 applied to the gate of MN3 at node N3 to be in high impedance condition, i.e., the tristate output of logic circuit G1 is floating.

If the voltage on the I/O pin 20 is raised rapidly, for example, during an ESD event then:

a) the gate/drain overlap capacitance $C_{gd3}$ of MN3 will raise the gate voltage of MN3;

b) the connection between the I/O pin 20 and VESD will cause VESD to rise and raise the tristate enable input of the logic circuit G1 into an active state at node N1, causing the tristate output of the logic circuit G1 applied to the gate of MN3 to be in a high impedance condition, i.e., the tristate output of logic circuit G1 is floating; and so c) the gate of MN3 will be allowed to rise to a positive voltage which will tend to turn MN3 on and which will dramatically reduce the first breakdown voltage of fingers of MN3 to a level lower than the second breakdown voltage. Hence, although one or more of the transistor fingers may go into the non-destructive snap back region during an ESD event, none of the fingers should typically reach the second breakdown region because of the positive voltage which has been applied to the gate of MN3 and which has been kept there.

If the tristate output of logic circuit G1 is in a low impedance condition, i.e., the tristate output of logic circuit G1 is determined by the state of the signals PDCE and PDD at the input of the logic circuit G1 (see FIG. 1), then the tristate output of logic circuit G1 at node N3 may typically discharge the gate node of MN3 very rapidly. The relationship between raising the gate node voltage of the pull down transistor MN3 and the resulting lowering of the transistor's first breakdown (snap back) voltage is well known. (Note R2 is the resistive equivalent of transistor MN6 of FIG. 1).

A more detailed operation of the ESD protection circuit according to the present invention will now be explained with reference to FIG. 1. The integrated circuit includes the output buffer having an N-channel pull up transistor MN1 and pair of N-channel pull down transistors MN2 and MN3, resistor R1, and I/O pin 20. In FIG. 1, D3 is a diode to Vss for negative ESD events, D1 is a diode to VESD for positive ESD events, and D2 is the diode between VCC and VESD. In addition, the voltage clamp circuit 10 may be optionally provided between VESD and VSS to limit the voltage on VESD to a predefined limit under an ESD event (e.g., 13 volts).

When a positive ESD pulse voltage is applied to the I/O pin 20, diode D1 will cause VESD to typically follow the voltage minus the voltage drop across diode D1. The ESD pulse on the I/O pin 20 will attempt to raise the gate voltage of MN3 because of the gate/drain overlap capacitance $C_{gd3}$. When VESD is pulsed by the positive ESD pulse voltage, the capacitor C1 (see FIG. 4) formed by transistor MN4 acts as a voltage divider with the capacitor C2 (see FIG. 4) formed by the gate node to source/drain capacitances $C_{gs6}$/$C_{gd6}$ and the gate node to base capacitance $C_{gb6}$ of transistor MN6. The gate node voltage on MN6 rises and MN6 turns on and pulls; the voltage on node N1 low. This in turn forces the tristate output of the logic circuit G1 at node N3 into a high impedance condition, i.e., the tristate output of logic circuit G1 is floating. The logic circuit G1 combines the output buffer data signal PDD and the output buffer enable signal PDCE and the tristate output of the logic circuit G1 drives the gate node of the pull down transistor MN3.

Figure 2:
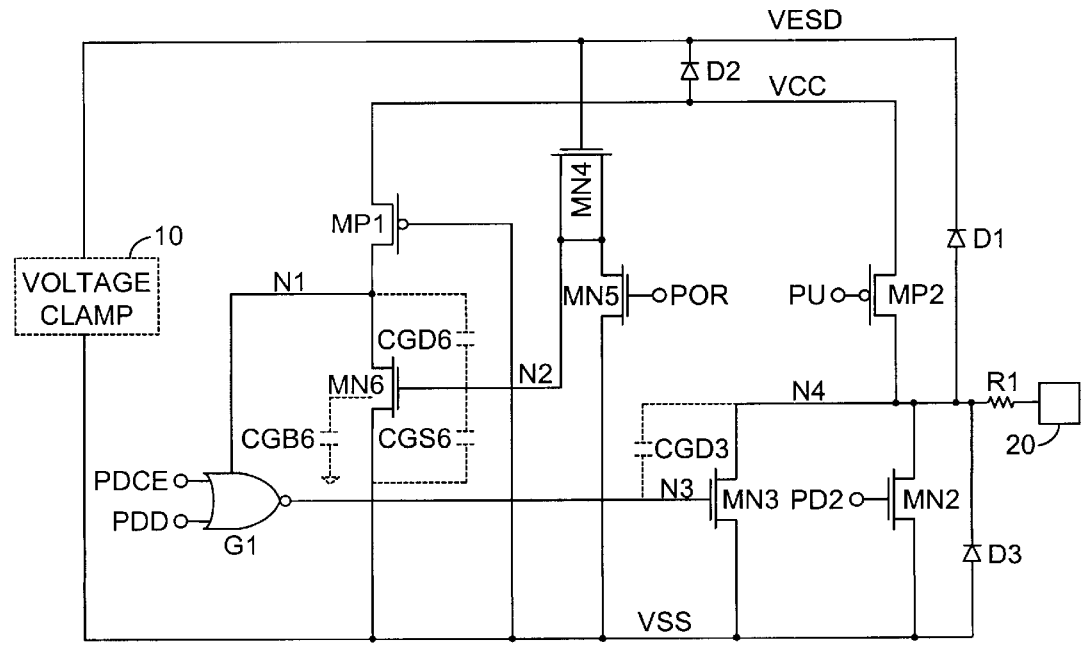
FIG. 2 is a circuit diagram of an ESD protection circuit coupled to an output buffer wherein the N-channel pull up transistor of FIG. 1 is replaced with a P-channel device and which also uses a power on reset signal, according to a second embodiment of the present invention.
Figure 3:
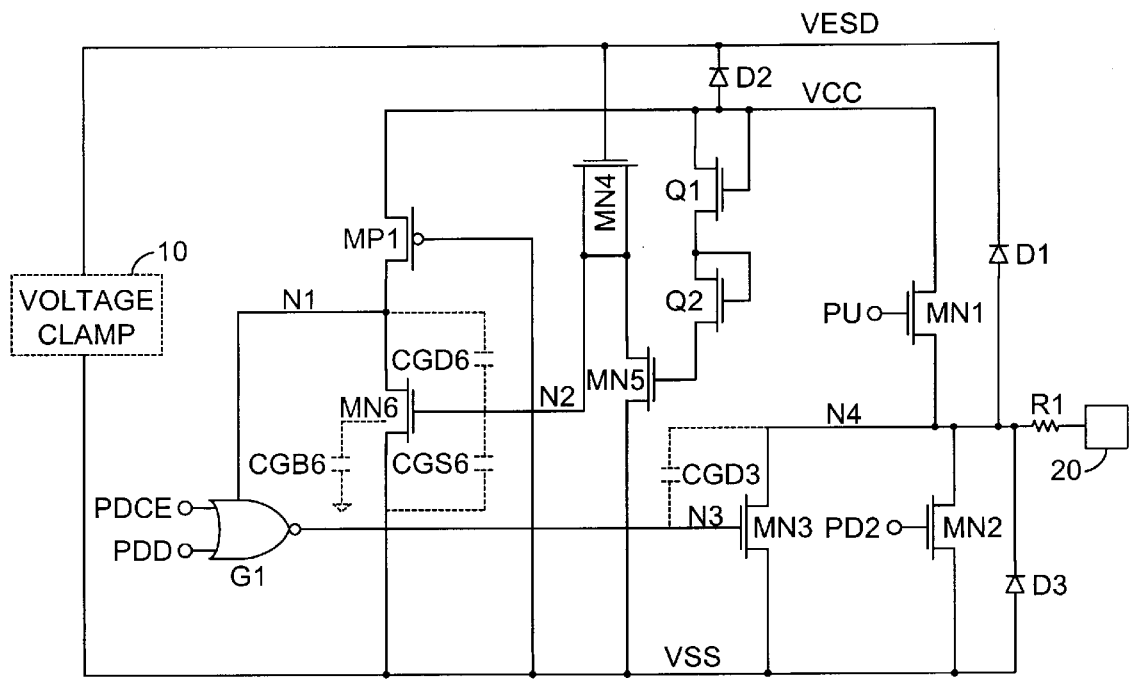
FIG. 3 is a circuit diagram of an ESD protection circuit wherein the power on reset signal of FIGS. 1 and 2 has been replaced by two pull down transistors Q1 and Q2, according to a third embodiment of the present invention.

Since the driving logic circuit G1 is in a high impedance condition and the gate node of MN3 is being pumped by the gate node to drain capacitance $C_{gd3}$ of MN3, the gate voltage at node N3 will rise and will reduce the snap back breakdown voltage of the channel regions under the fingers of transistor MN3. As the ESD pulse dies away the voltage on the gate node of MN6 will decay. Under normal DC conditions, the gate node of MN6 is held low by the bleed transistor MN5. This transistor MN5 needs to be off during an ESD event and this is achieved either by:

a) connecting the gate node of MN5 to a power on reset (POR) signal on the integrated circuit which is kept low when VCC initially powers up (as it will be, for example, during an ESD pulse because of diode D2 which connects VCC and VESD), as shown in FIG. 1 (see also FIG. 2); or b) connecting the gate of MN5 to VCC via a couple of diode connected N-channel transistors Q1 an Q2 (see FIG. 3). This ensures that VCC reaches at least 3 to 3.5 volts before MN5 begins to turn on.

Note that because there is a diode D2 connecting VESD and VCC, noise on the VCC line during a normal switching operation will be coupled to VESD. However, because of the voltage divider effect of the capacitors C1 and C2 (see FIG. 4) linking VESD to MN6, the AC noise signal on the gate of MN6 is very small and node N1 will typically not be affected. The voltage on node N1 is pulled high in normal operating conditions by the bleed transistor MP1 whose gate node is tied to VSS. Therefore, unless there is very large positive voltage pulse on the I/O pin 20, node N1 is typically not affected and hence the tristate output of the logic circuit G1 which drives MN3 is in a low impedance condition, i.e., the tristate output of logic circuit G1 is determined by the state of the signals PDCE and PDD at the input of the logic circuit G1.

The transistor MN3, which is a pull down device, has its gate node driven by the tristate output of the logic circuit G1 at node N3. The logic circuit G1 is driven by signals PDCE and PDD and has a tristate output (i.e., the tristate output is one of a logic "1" state, a logic "0" state or a high impedance state) at node N3 that is controlled via the connection at node N1. There is a fixed connection between the I/O pin 20 and the internal bus VESD via the resistor R1 and the diode D1 so that when the voltage on the I/O pin 20 is raised, so is the voltage on VESD.

The circuit which controls the tristate output of logic circuit G1 (i.e., MP1 and MN6) is itself controlled by a signal at node N2. Under normal operation, transistor MP1 connected between node N1 and VCC pulls the tristate enable input of the logic circuit G1 at node N1 high forcing the tristate output of the logic circuit G1 into a low impedance condition, i.e., the tristate output of logic circuit G1 is determined by the state of the signals PDCE and PDD at the input of the logic circuit G1.

FIG. 2 shows a second embodiment of the ESD protection circuit of FIG. 1, wherein the transistor MN1 is replaced with a P-channel transistor MP2 without affecting the performance of the ESD protection circuit.

FIG. 3 shows a third embodiment of the ESD protection circuit of FIG. 1 wherein the power on reset (POR) signal at the gate of MN5 is not used, but instead the gate of MN5 is connected to VCC via a couple of diode connected N-channel transistors Q1 and Q2 without affecting the performance of the ESD protection circuit of FIGS. 1 and 2.

According to the present invention, during a normal ESD positive event with respect to VSS, one finger of the pull down transistor MN3 will typically snap back when the voltage on I/O pin 20 reaches about 13 volts. The circuit according to the present invention will typically reduce the snap back voltage on all the fingers of transistor MN3, as previously discussed, so that typically none of the fingers which have been snapped back reach the second breakdown voltage irrespective of the potential drop across the I/O pin 20 to output transistor resistance R1.

Although the preferred embodiments of the ESD protection circuit are described in terms of a diode D2 coupling VESD and VCC, the diode D2 may be replaced by a complex voltage breakdown diode stack (i.e., a combination of plural series and/or parallel connected diodes) which would allow VESD to go substantially higher than one diode drop above VCC before it breaks down and pulls VCC up (e.g., 8 to 10 volts), as will be apparent to those skilled in the electronic arts.

Although the preferred embodiments of the ESD protection circuit are described in terms of N-channel and P-channel transistors, some or all of the N-channel and P-channel transistors may be replaced by P-channel and N-channel transistors, respectively, as will be apparent to those skilled in the electronic arts.

Although the preferred embodiments of the ESD protection circuit are described in terms of a logic circuit G1, the logic circuit G1 may be replaced by other logic, as will be apparent to those skilled in the electronic arts.

Although the preferred embodiments of the ESD protection circuit are described in terms of a diode D2 coupling VESD and VCC, in some applications the diode D2 may not be needed and VESD may be the same as VCC, as will be apparent to those skilled in the electronic arts.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrostatic discharge (ESD) protection circuit for an output transistor of an integrated circuit, comprising:

a logic circuit having at least one data input, a tristate enable input, and a tristate output coupled to a gate node of the output transistor of the integrated circuit; and a tristate enable circuit coupled to the tristate enable input of the logic circuit;

wherein the tristate enable circuit is configured to place the tristate output of the logic circuit in a high impedance state during an ESD event occurring on a source-drain path of the output transistor of the integrated circuit.

2. The electrostatic discharge (ESD) protection circuit according to claim 1, wherein the logic circuit comprises:
a NOR gate having first and second data inputs, a tristate enable input, and an tristate output.

3. The electrostatic discharge (ESD) protection circuit according to claim 1, wherein the tristate enable circuit drives the tristate enable input of the logic circuit to a first logic level so as to place the tristate output of the logic circuit in a low impedance state during normal operation, and the tristate enable circuit drives the tristate enable input of the logic circuit to a second logic level to place the tristate output of the logic circuit in the high impedance state during an ESD event.

4. The electrostatic discharge (ESD) protection circuit according to claim 3, wherein tristate enable circuit comprises:
a first transistor having a gate and a source-drain path; and
a second transistor having a gate and a source-drain path;
wherein the source-drain paths of the first and second transistors are coupled in series between a first and second power sources, the gate of the first transistor is coupled to the second power source, and a connection point of the source-drain paths of the first and second transistors is coupled to the tristate enable input of the logic circuit.

5. The electrostatic discharge (ESD) protection circuit according to claim 4, wherein tristate enable circuit further comprises:
a third transistor having a gate and a source-drain path; and
a fourth transistor having a gate and a source-drain path;
wherein the source-drain paths of the third and fourth transistors are coupled in series between the second power source and the gate of the second transistor, the gate of the third transistor is coupled to a third power source, and the gate of the fourth transistor is coupled to a power on reset (POR) signal.

6. The electrostatic discharge (ESD) protection circuit according to claim 5, wherein tristate enable circuit further comprises:
first and second diodes coupled in series between the third and second power sources; and
a third diode coupled between the first and third power sources;
wherein a connection point of the first and second diodes is coupled to the source-drain path of the output transistor of the integrated circuit.

7. The electrostatic discharge (ESD) protection circuit according to claim 6, further comprises:
a fifth transistor having a gate and a source-drain path; and
a sixth transistor having a gate and a source-drain path;
wherein the source-drain paths of the fifth and sixth transistors are coupled in series between the first and second power sources, and a connection point of the source-drain paths of the fifth and sixth transistors is coupled to the source-drain path of the output transistor of the integrated circuit.

8. The electrostatic discharge (ESD) protection circuit according to claim 7, further comprising:
a voltage clamp circuit coupled between the third and second power sources.

9. The electrostatic discharge (ESD) protection circuit according to claim 7, wherein the first transistor is a P-channel transistor, the second through sixth transistors are N-channel transistors, the first power source is VCC, the second power source is VSS, and the third power source is VESD.

10. The electrostatic discharge (ESD) protection circuit according to claim 7, wherein the first and fifth transistors are P-channel transistors, the second through fourth and sixth transistors are N-channel transistors, the first power source is VCC, the second power source is VSS, and the third power source is VESD.

11. The electrostatic discharge (ESD) protection circuit according to claim 4, wherein tristate enable circuit further comprises:
a third transistor having a gate and a source-drain path;
a fourth transistor having a gate and a source-drain path;
a fifth transistor having a gate and a source-drain path; and
a sixth transistor having a gate and a source-drain path;
wherein the source-drain paths of the third and fourth transistors are coupled in series between the second power source and the gate of the second transistor, the gate of the third transistor is coupled to a third power source, the source-drain paths of the fifth and sixth transistors are coupled in series between the first power source and the gate of the fourth transistor, the gate of the fifth transistor is coupled to the first power source, and the gate of the sixth transistor is coupled to a connection point of the source-drain paths of the fifth and sixth transistors.

12. The electrostatic discharge (ESD) protection circuit according to claim 11, wherein tristate enable circuit further comprises:
first and second diodes coupled in series between the third and second power sources; and
a third diode coupled between the first and third power sources;
wherein a connection point of the first and second diodes is coupled to the source-drain path of the output transistor of the integrated circuit.

13. The electrostatic discharge (ESD) protection circuit according to claim 12, further comprising:
a seventh transistor having a gate and a source-drain path; and
a eighth transistor having a gate and a source-drain path;
wherein the source-drain paths of the seventh and eighth transistors are coupled in series between the first and second power sources, and a connection point of the source-drain paths of the seventh and eighth transistors is coupled to the source-drain path of the output transistor of the integrated circuit.

14. The electrostatic discharge (ESD) protection circuit according to claim 13, further comprising:
a voltage clamp circuit coupled between the third and second power sources.

15. The electrostatic discharge (ESD) protection circuit according to claim 13, wherein the first transistor is a P-channel transistor, the second through eighth transistors are N-channel transistors, the first power source is VCC, the second power source is VSS, and the third power source is VESD.

16. The electrostatic discharge (ESD) protection circuit according to claim 10, wherein the first and seventh transistors are P-channel transistors, the second through sixth and eighth transistors are N-channel transistors, the first power source is VCC, the second power source is VSS, and the third power source is VESD.

17. A method for electrostatic discharge (ESD) protection of an output transistor of an integrated circuit, comprising the steps of:

placing a gate node of the output transistor of the integrated circuit in a high impedance state during an ESD event by driving a tristate enable input of a logic circuit having an tristate output coupled the gate node of the output transistor of the integrated circuit to a logic level so as to place the tristate output of the logic circuit in the high impedance state during-the ESD event; and placing the gate node of the output transistor of the integrated circuit in a low impedance state during normal operation.

18. The electrostatic discharge (ESD) protection circuit according to claim 17, wherein the step of placing the gate node of the integrated circuit in the low impedance state comprises:

driving a tristate enable input of a logic circuit having an tristate output coupled the gate node of the output transistor of the integrated circuit to a logic level so as to place the tristate output of the logic circuit in the low impedance state during the normal operation.

* * * * *